(12) United States Patent
LaMeres et al.

(10) Patent No.: US 7,242,203 B2
(45) Date of Patent: Jul. 10, 2007

(54) PROBE RETENTION KIT, AND SYSTEM AND METHOD FOR PROBING A PATTERN OF POINTS ON A PRINTED CIRCUIT BOARD

(75) Inventors: Brock J. LaMeres, Colorado Springs, CO (US); Brent Holcombe, Colorado Springs, CO (US); Kenneth Johnson, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 110 days.

(21) Appl. No.: 10/918,236

(22) Filed: Aug. 13, 2004

(65) Prior Publication Data

US 2006/0033518 A1 Feb. 16, 2006

(51) Int. Cl.
*G01R 31/02* (2006.01)
*H01R 13/28* (2006.01)

(52) U.S. Cl. ..................... 324/758; 439/289

(58) Field of Classification Search ............. None
See application file for complete search history.

(56) References Cited

U.S. PATENT DOCUMENTS 4,504,783 A * 3/1985 Zasio et al. ............... 324/754
5,366,380 A * 11/1994 Reymond ..................... 439/66
6,188,028 B1 * 2/2001 Haba et al. ................ 174/266

OTHER PUBLICATIONS

Brent A. Holcombe, et al., Connector-Less Probe, U.S. Appl. No. 10/373,820, filed Feb. 25, 2003.
Brent A. Holcombe, et al., "Alignment/Retention Device for Connector-Less Probe", U.S. Appl. No. 10/644,365, filed Aug. 20, 2003.
Brock J. LaMeres, et al., "Backside Attach Probe, Components thereof, and Methods for Making and Using Same", U.S. Appl. No. 10/902,405, filed on Jul. 28, 2004.
Brock J. LaMeres, et al., "Probes with Perpendicularly Disposed Spring Pins, and Methods of Making and Using Same", U.S. Appl. No. 10/781,086, filed Feb. 17, 2004.
Agilent Technologies, Inc., www.agilent.com, "Probing Solutions for Logic Analyzers", Mar. 1, 2004, pp. 1-57.
Brock J. LaMeres, et al., "Apparatus, Method, and Kit for Probing a Pattern of Points on a Printed Circuit Board", U.S. Patent Application (17 pages of specification including claims and abstract, and six (6) sheets of formal drawings (Figs. 1-6), filed Aug. 13, 2004.

* cited by examiner

*Primary Examiner*—Ernest Karlsen

(57) ABSTRACT

A probe retention kit may include a plurality of probe retention devices, each having: (i) a base; (ii) a retention mechanism, coupled to the base, for mechanically coupling a probe substrate with the plurality of probe retention devices; and (iii) solder legs to be inserted into a printed circuit board, the solder legs having opposite ends that extend through the base and provide an alignment mechanism for receiving the probe substrate. Alternative probe retention devices, and systems and methods using same, are also disclosed.

7 Claims, 5 Drawing Sheets

US 7,242,203 B2

PROBE RETENTION KIT, AND SYSTEM AND METHOD FOR PROBING A PATTERN OF POINTS ON A PRINTED CIRCUIT BOARD

BACKGROUND

Connector-less probing has emerged as an attractive form of probing for logic analyzers and other test equipment. In connector-less probing, a customer may design their printed circuit board (PCB) to incorporate a "landing pattern" of test points. The customer then attaches a connector-less probe to their test equipment, and mounts the connector-less probe to their PCB so that a plurality of spring-pins on the probe engage the plurality of test points in their PCB's landing pattern.

One embodiment of a connector-less probe is disclosed in the United States Patent Application of Brent A. Holcombe, et al. entitled "Connector-Less Probe" (Ser. No. 10/373,820, filed Feb. 25, 2003). An alignment/retention device for mounting a connector-less probe to a PCB is disclosed in the United States Patent Application of Brent A. Holcombe, et al. entitled "Alignment/Retention Device For Connector-Less Probe" (Ser. No. 10/644,365, filed Aug. 20, 2003).

Connector-less probes for probing a plurality of breakout vias on the backside of a printed circuit board to which a grid array package is attached are disclosed in the United States Patent Application of Brock J. LaMeres, et al. entitled "Backside Attach Probe, Components Thereof, and Methods for Making and Using Same" (Attorney Docket Numer 10030947-1, filed on Jul. 28, 2004).

Agilent Technologies, Inc. (headquartered in Palo Alto, Calif.) markets a number of connector-less probing solutions under the name "Soft Touch".

SUMMARY

One aspect of the invention is embodied in a system comprising a printed circuit board (PCB) and a plurality of probe retention devices. The PCB has a pattern of points to be probed. The plurality of probe retention devices are mounted on the PCB adjacent the pattern of points to be probed. Each probe retention device has a retention mechanism and an alignment mechanism.

Another aspect of the invention is embodied in a method for probing a pattern of points on a PCB. The method comprises mechanically coupling a plurality of probe retention devices, each having a retention mechanism and an alignment mechanism, to positions adjacent the pattern of points on the PCB. A probe substrate, having a plurality of compression interconnects therein, is then aligned with the alignment mechanisms. The probe substrate is then mechanically engaged with the retention mechanisms, thereby causing the compression interconnects to seat against the pattern of points.

Yet another aspect of the invention is embodied in a probe retention kit. The kit comprises a plurality of probe retention devices. Each probe retention device has a base, a retention mechanism, and solder legs. The retention mechanism is coupled to the base for mechanically coupling a probe substrate with the plurality of probe retention devices. The solder legs are provided for insertion into a PCB. Opposite ends of the solder legs extend through the base and provide an alignment mechanism for receiving the probe substrate.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE INVENTION

After loading a printed circuit board (PCB 100) with a number of components 102, the loaded board must be tested. At times, an engineer may conduct tests by probing a pattern of points 104 on the PCB 100.

Figure 1:
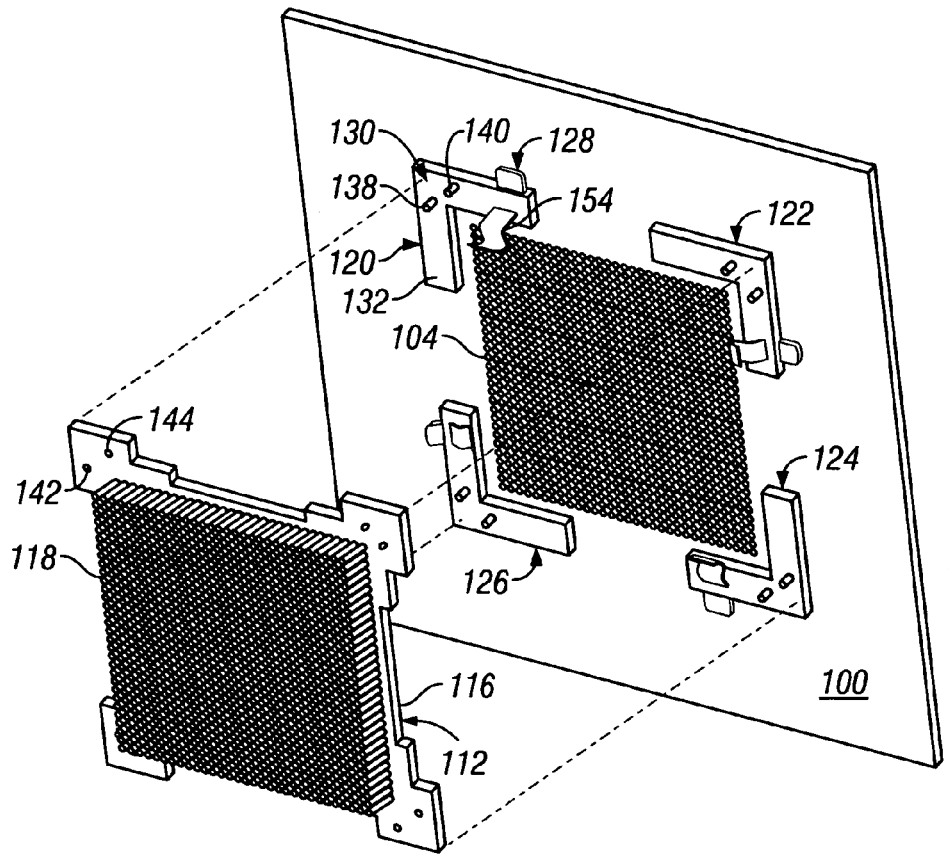
FIGS. 1 & 2 illustrate the assembly of an exemplary system for probing a pattern of points on a PCB.
Figure 2:
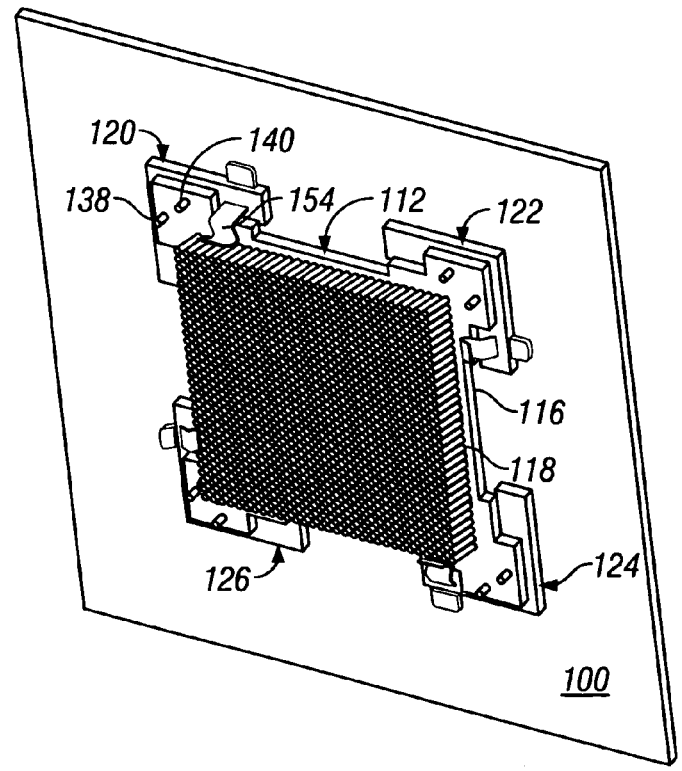
Figure 3:
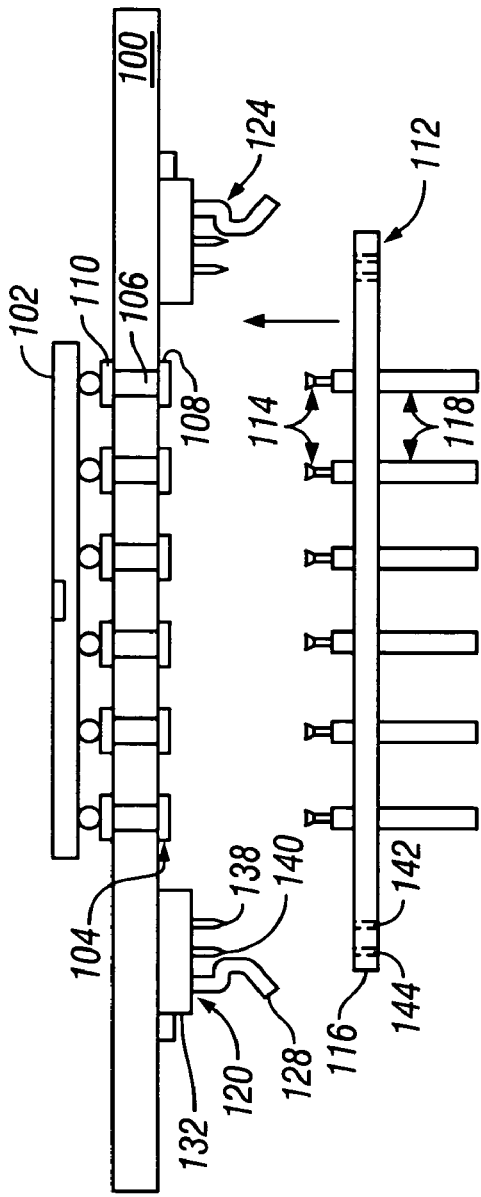
FIGS. 3 & 4 also illustrate the assembly of the system shown in FIGS. 1 & 2, but from an elevation perspective.
Figure 4:
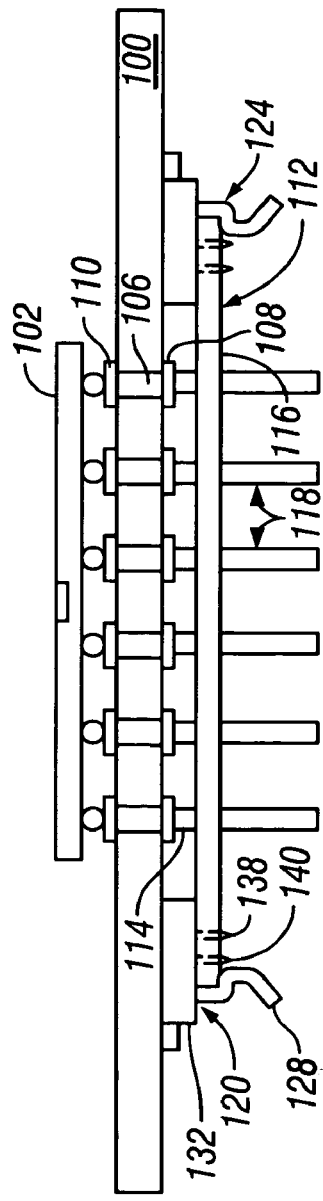

An exemplary pattern of points 104 is variously shown in each of FIGS. 1-4. As shown in FIGS. 3 & 4, the pattern of points 104 may be positioned on a PCB 100 opposite the side to which a component 102 such as an integrated circuit (IC) is attached. Alternately, the pattern of points 104 could be 1) positioned on the same side of the PCB 100 as the component 102, or 2) coupled to other and/or different components.

By way of example, the pattern of points 104 shown in FIGS. 3 & 4 is coupled to the IC 102 by means of breakout vias (e.g., 106) in the PCB 100. For purposes of illustration, each of the breakout vias 106 is shown to be bounded above and below by a somewhat thick pad (e.g., 108, 110). Typically, however, these pads 108, 110 will be very thin.

One way to probe a pattern of points 104 on a PCB 100 is via a probe 112 having a plurality of compression interconnects (e.g., 114) therein. As shown in FIG. 1-4, such a probe 112 may generally comprise a substrate 116 formed of an insulating material (e.g., plastic or FR4). The probe's compression interconnects 114 may then be molded, press fitted, snapped, clipped, screwed, soldered or otherwise secured in its substrate 116 so that they are maintained in a pattern that corresponds to the pattern of points 104 to be probed.

The compression interconnects 114 of a probe 112 may take the form of any of a number of different electrically conductive and compressible devices (or materials). In FIGS. 1-4, the compression interconnects 114 take the form of spring pins with crowned tips. However, the compression interconnects could also take the form of c-springs or conductive elastomers.

Coupled to (or extending from) each compression interconnect 114 is a tail (e.g., 118) or extension that protrudes from the surface of the probe substrate 116 opposite the compression interconnects 114. In some cases, the tails 118 may comprise rigid fixed pins, as shown in FIGS. 1-4. In other cases, the tails 118 may comprise flexible extensions, such as wires. The tails or extensions 118 of the compression interconnects 114 provide a means for coupling leads or cables of a test instrument to the compression interconnects 114.

By way of example, a number of additional probes containing compression interconnects are disclosed in the United States Patent Application of Brock J. LaMeres, et al. entitled "Backside Attach Probe, Components Thereof, and Methods for Making and Using Same" (Attorney Docket Number 10030947-1, filed on Jul. 28, 2004).

In use, the compression interconnects 114 of a probe 112 are aligned with a pattern of points 104 to be probed, and pressure is applied to the probe 112 to seat the compression interconnects 114 against the pattern of points 104 (see FIGS. 2 & 4).

Depending on the pattern of points 104 to be probed, the required number and placement of compression interconnects 114 in a probe 112 will vary. Different applications therefore require the development of different sizes and shapes of probes.

Figure 5:
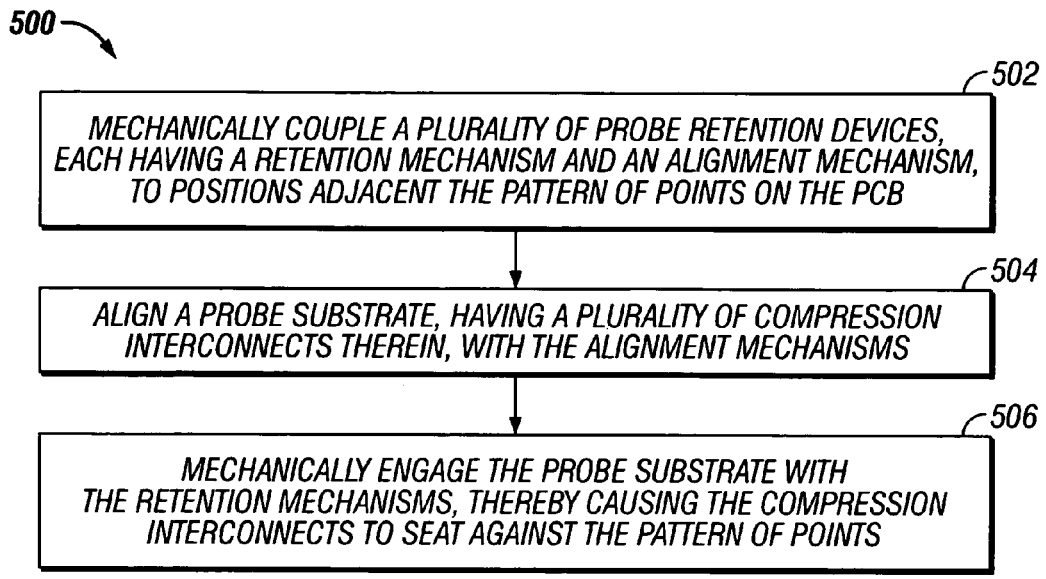
FIG. 5 illustrates a method for probing a pattern of points on a PCB.

To maintain compression on its compression interconnects 114, thereby assuring that its compression interconnects 114 remain firmly seated against a pattern of points 104 to be probed, a probe 112 typically needs to be secured to a PCB 100. Usually, this is accomplished via a connector or bracket of fixed size that is attached to the PCB 100. Given that it is expensive to design a corresponding connector or bracket for each possible size or shape of probe, the sizes and shapes of probes are typically limited by available connector sizes. It would be preferable, however, if this limitation on probe shapes and sizes did not exist. FIG. 5 therefore provides a new method 500 for probing a pattern of points 104 on a PCB 100.

In accordance with the method 500, a plurality of probe retention devices 120, 122, 124, 126, each having a retention mechanism (e.g., 128) and an alignment mechanism (e.g., 130), are mechanically coupled 502 to positions adjacent a pattern of points 104 on a PCB 100. The probe retention devices 120-126 may be coupled to the PCB 100 by, for example, clipping, snapping, soldering, screwing, or press fitting them into the PCB 100.

After coupling the probe retention devices 120-126 to the PCB 100, a probe substrate 116 having a plurality of compression interconnects 114 therein may be aligned 504 with the retention devices' alignment mechanisms 130. The probe substrate 116 may then be mechanically engaged 506 with the retention mechanisms 128, thereby causing the compression interconnects 114 to seat against the pattern of points 104. The probe substrate 116 may be engaged with the retention mechanisms 128 by, for example, clipping it to (or press fitting it with) the retention mechanisms 128.

FIGS. 1-4 show one exemplary way of implementing the method 500.

As shown in FIGS. 1 & 2, probe retention devices 120-126 may be mounted to the PCB 100 in a square or rectangular configuration around a pattern of points 104 to be probed (although other mounting configurations are possible). Note that, as a result of the retention devices 120-126 being modular, the retention devices 120-126 may be mounted to encompass larger or smaller surface areas of the PCB 100, and more or fewer points to be probed. The retention devices 120-126 therefore provide a scalable probe retention solution.

Figure 6:
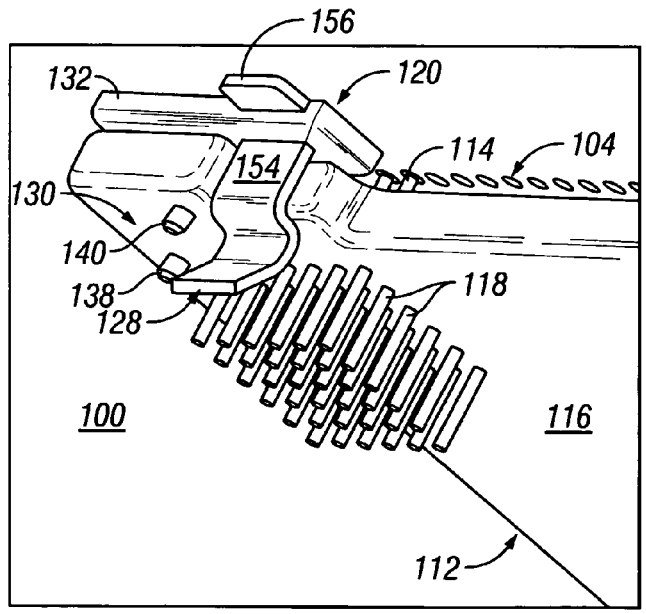
FIG. 6 illustrates an exemplary probe retention device mounted on a PCB and mechanically retaining a probe substrate.
Figure 7:
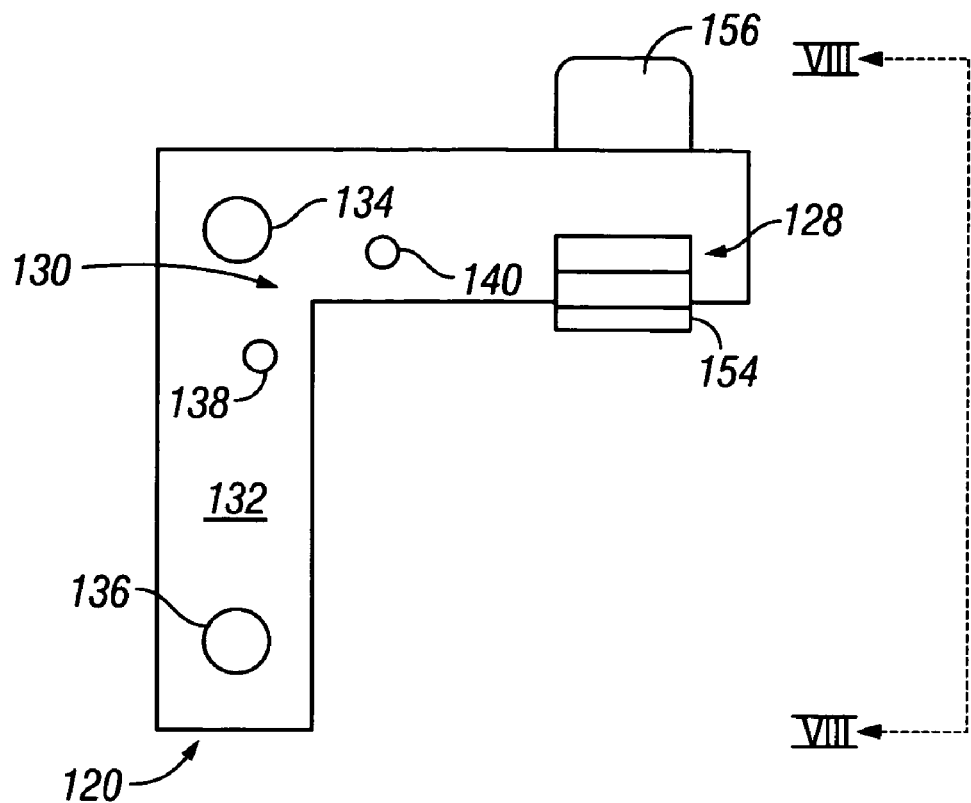
FIG. 7 illustrates a plan view of an the probe retention device shown in FIG. 6.
Figure 8:
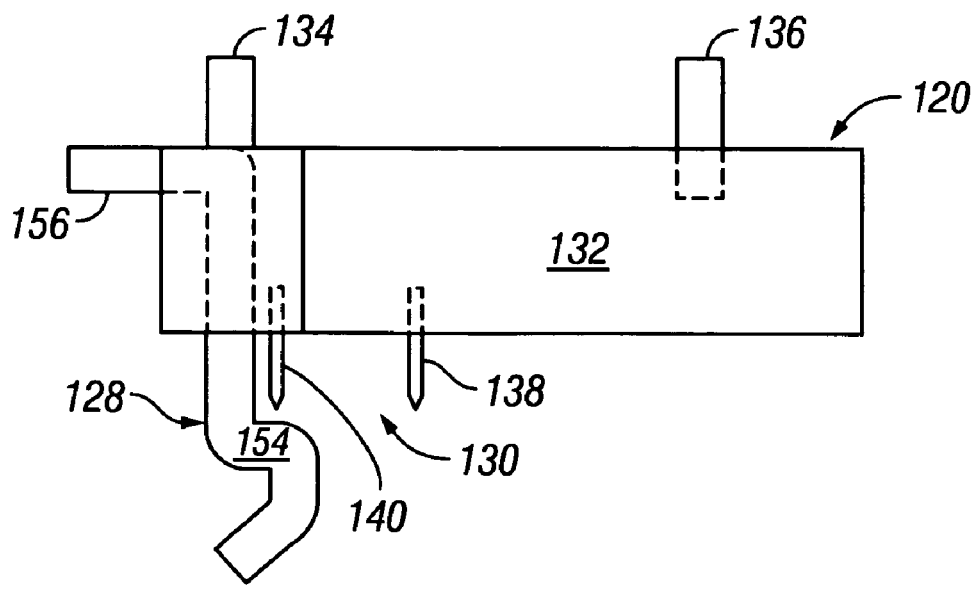
FIG. 8 illustrates a cross-sectional view of the probe retention device shown in FIG. 6.

As shown in FIGS. 6-8, each probe retention device 120 may generally comprise an L-shaped base 132 of rigid plastic material. The thicknesses of the bases 132 are sized to impart a desired compression to the compression interconnects 114 of a probe 112. Each base 132 has at least one solder leg 134 molded therein (and preferably two 134, 136) which extend(s) perpendicularly from the base 132 toward the PCB 100. Each probe retention device 120 also comprises an alignment mechanism 130 and a retention mechanism 128, both of which extend from the base 132 of the probe retention device 120 opposite its solder legs 134, 136 (i.e. away from the PCB 100). In one embodiment, a retention device 120 is manufactured by injection molding its base 132 around its solder legs 134, 136, retention mechanism 128, and alignment mechanism 130.

As shown in FIGS. 6-8, the alignment mechanism 130 of a retention device 120 may comprise a pair of rigid pins 138, 140 extending from the base 132. However, the alignment mechanism 130 could comprise any number of pins (even one). In one embodiment, the pins 138, 140 may comprise extensions of a retention device's solder legs 134, 136.

Figure 9:
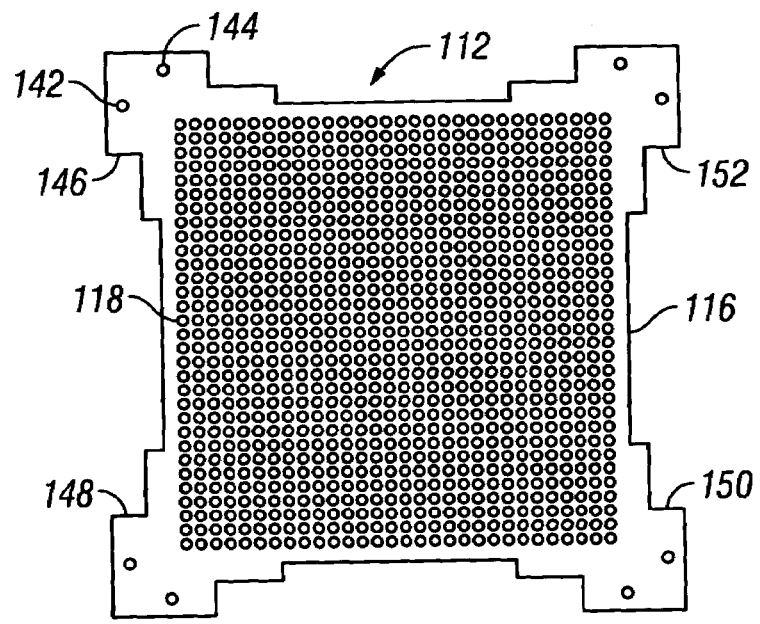
FIG. 9 illustrates a plan view of the probe substrate shown in FIG. 6.

The pins 138, 140 of each alignment mechanism 130 mate with corresponding holes 142, 144 (FIG. 9) in the corners of the probe substrate 116. The pins 138, 140 provide a fine alignment of the probe 112, prior to the compression interconnects 114 of the probe 112 coming in contact with the points 104 they are to probe. To first provide a gross alignment of the probe 112 with a pattern of points 104, the perimeter of the probe substrate 116 may be notched 146, 148, 150, 152 (see FIG. 9). If the retention mechanisms 128 extend farther from the probe substrate 116 than the alignment mechanisms 130, the notches 146-152 in the probe substrate 116 can be configured such that they mate with the surfaces of the retention mechanisms 128 to grossly align the pins 138, 140 of the alignment mechanisms 130 with the holes 142, 144 in the probe substrate 116.

As illustrated in FIGS. 6 & 8, for example, the retention mechanisms 128 may comprise biased clips 154. Alternatively, other embodiments of the retention mechanisms are possible, such as threaded pins, snap rivets, or any other mechanism suitable for retaining the probe substrate. The retention mechanisms 128 are preferably metallic, but may also be formed of other materials, such as plastic. As best seen in FIG. 6, each retention mechanism 128 may comprise a foot 156 that rests against the PCB 100. The foot 156 is useful in providing support for the retention mechanism 128 so that the retention mechanism does not bend or snap as a result of the forces placed upon it by the compressed interconnects 114 of the probe 112.

Figure 10:
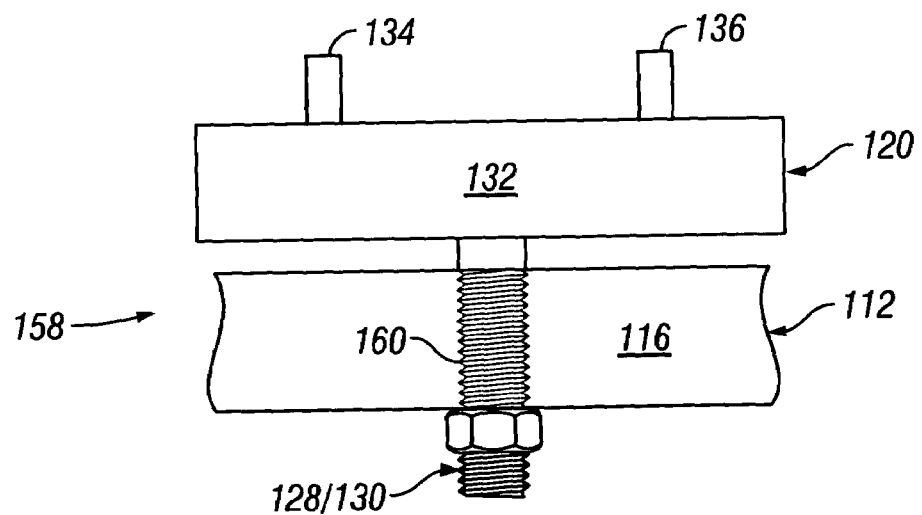
FIG. 10 illustrates an exemplary probe retention device having a unitary retention and alignment mechanism.

FIG. 10 illustrates an alternate probe retention device 158, wherein the retention and alignment mechanisms of the device 158 are provided by a unitary structure such as a threaded pin 160. In this manner, the pin aids in aligning a probe 112, and the threads provide a means for securing the probe 112 (e.g., via a nut). However, although the device 158 provides a reduced part count, it fails to provide a predetermined compression to a probe's compression interconnects 114 (i.e., because compression is determined by nut tightness).

Although the probe retention devices 120-126, 158 disclosed herein may be provided to a user pre-assembled to a PCB 100, they are preferably provided to a user in kit form.

What is claimed is:

1. A method for probing a pattern of points on a printed circuit board, comprising:
    mechanically coupling a plurality of probe retention devices, each having i) a retention mechanism, and ii) an alignment mechanism having a number of rigid pins, to positions adjacent the pattern of points on the printed circuit board;
    aligning a plurality of holes in a probe substrate with the rigid pins of the alignment mechanisms, thereby aligning i) a plurality of compression interconnects attached to the probe substrate with ii) corresponding points in the pattern of points; and mechanically engaging the probe substrate with the retention mechanisms, thereby causing the compression interconnects to seat against the pattern of points.

2. The method of claim 1, further comprising, prior to aligning the plurality of holes in the probe substrate with the rigid pins of the alignment mechanisms, grossly aligning the probe substrate with the alignment mechanisms by engaging a number of notches at perimeter of the probe substrate with a number of surfaces of the plurality of probe retention devices.

3. The method of claim 2, wherein the surfaces are surfaces of the retention mechanisms.

4. The method of claim 1, wherein mechanically engaging the probe substrate with the retention mechanisms comprises clipping the probe substrate into the retention mechanisms.

5. The method of claim 1, wherein mechanically engaging the probe substrate with the retention mechanisms comprises press fitting the probe substrate with the retention mechanisms.

6. A method for probing a pattern of points on a printed circuit board, comprising:

mechanically coupling a plurality of probe retention devices, each having a retention mechanism and an alignment mechanism, to positions adjacent the pattern of points on the printed circuit board;

grossly aligning a probe substrate with the alignment mechanisms by engaging a number of notches at a perimeter of the probe substrate with a number of surfaces of the probe retention devices; finely aligning i) a plurality of compression interconnects attached to the probe substrate with ii) corresponding points in the pattern of points, by using the alignment mechanisms; and mechanically engaging the probe substrate with the retention mechanisms, thereby causing the compression interconnects to seat against the pattern of points.

7. The method of claim 6, wherein the surfaces are surfaces of the retention mechanisms.

* * * * *

UNITED STATES PATENT AND TRADEMARK OFFICE
CERTIFICATE OF CORRECTION

| | | |
|---|---|---|
| PATENT NO. | : 7,242,203 B2 | Page 1 of 1 |
| APPLICATION NO. | : 10/918236 | |
| DATED | : July 10, 2007 | |
| INVENTOR(S) | : LaMeres et al. | |

It is certified that error appears in the above-identified patent and that said Letters Patent is hereby corrected as shown below:

In column 5, line 11, in Claim 2, before "perimeter" insert -- a --.

Signed and Sealed this

Fourth Day of December, 2007

JON W. DUDAS
*Director of the United States Patent and Trademark Office*